United States Patent
Kang et al.

(10) Patent No.: US 10,998,477 B2
(45) Date of Patent: *May 4, 2021

(54) POLYESTER RESIN COMPOSITION HAVING IMPROVED MECHANICAL PROPERTIES AND MOLDABILITY

(71) Applicant: LOTTE CHEMICAL CORPORATION, Seoul (KR)

(72) Inventors: Tae Gon Kang, Uiwang-si (KR); Chan Moo Park, Uiwang-si (KR); Yoo Jin Jung, Uiwang-si (KR); Jong Cheol Lim, Uiwang-si (KR); Sang Hyun Hong, Uiwang-si (KR); Tae Soo Kim, Uiwang-si (KR); Young Ho Park, Uiwang-si (KR)

(73) Assignee: Lotte Chemical Corporation, Seoul (KR)

( * ) Notice: Subject to any disclaimer, the term of this patent is extended or adjusted under 35 U.S.C. 154(b) by 14 days.

This patent is subject to a terminal disclaimer.

(21) Appl. No.: 16/451,706

(22) Filed: Jun. 25, 2019

(65) Prior Publication Data

US 2019/0319177 A1    Oct. 17, 2019

Related U.S. Application Data

(63) Continuation of application No. 14/674,214, filed on Mar. 31, 2015, now Pat. No. 10,468,568.

(30) Foreign Application Priority Data

Apr. 1, 2014    (KR) .................. 10-2014-0038568
Mar. 24, 2015    (KR) .................. 10-2015-0040579

(51) Int. Cl.
| | |
|---|---|
| *H01L 33/60* | (2010.01) |
| *C08K 7/14* | (2006.01) |
| *C08K 3/34* | (2006.01) |
| *C08K 3/22* | (2006.01) |
| *C08K 3/013* | (2018.01) |

(52) U.S. Cl.
CPC .............. *H01L 33/60* (2013.01); *C08K 3/013* (2018.01); *C08K 3/22* (2013.01); *C08K 3/346* (2013.01); *C08K 7/14* (2013.01); *C08K 2003/2241* (2013.01); *H01L 2224/48091* (2013.01); *H01L 2933/0033* (2013.01); *H01L 2933/0058* (2013.01)

(58) Field of Classification Search
CPC ......... C08L 67/02; C08K 3/0033; C08K 3/22; C08K 3/346; C08K 7/14; C08K 2003/2241; C08K 3/013; H01L 2224/48091; H01L 2924/00012; H01L 2933/0033; H01L 2933/0058; H01L 33/60
See application file for complete search history.

(56) References Cited

U.S. PATENT DOCUMENTS

| | | | |
|---|---|---|---|
| 9,153,757 B2 * | 10/2015 | Ogasawara | ........... C08F 255/10 |
| 10,468,568 B2 * | 11/2019 | Kang | ................ C08K 7/14 |
| 2013/0217830 A1 | 8/2013 | Crawford et al. | |
| 2014/0167091 A1 | 6/2014 | Ogasawara et al. | |
| 2015/0280085 A1 | 10/2015 | Kang et al. | |

FOREIGN PATENT DOCUMENTS

| | | |
|---|---|---|
| JP | 2013-032426 A | 2/2013 |
| KR | 10-2013-0076733 A | 7/2013 |
| WO | 2013/018360 A1 | 2/2013 |

OTHER PUBLICATIONS

Turner et al., "Amorphous and Crystalline Polyesters based on 1,4-Cyclohexanedimethoanol," Modern Polyesters: Chemistry and Technology of Polyesters and Copolyesters (2004).

* cited by examiner

*Primary Examiner* — Ling Siu Choi
*Assistant Examiner* — Gennadiy Mesh
(74) *Attorney, Agent, or Firm* — Addion, Pendleton & Witherspoon, P.A.

(57) ABSTRACT

A polyester resin composition includes: (A) polycyclohexylenedimethylene terephthalate (PCT) resin which is a polymer of terephthalic acid and cyclohexanedimethanol, wherein the cyclohexanedimethanol has a trans/cis isomer ratio of about 2.3 or more; (B) a white pigment, wherein the white pigment is titanium dioxide; and (C) inorganic fillers, wherein the inorganic fillers are glass fibers. A molded article formed from the polyester resin composition can exhibit improved mechanical properties and moldability, and thus can be suitable for light emitting diode (LED) reflectors.

6 Claims, 1 Drawing Sheet

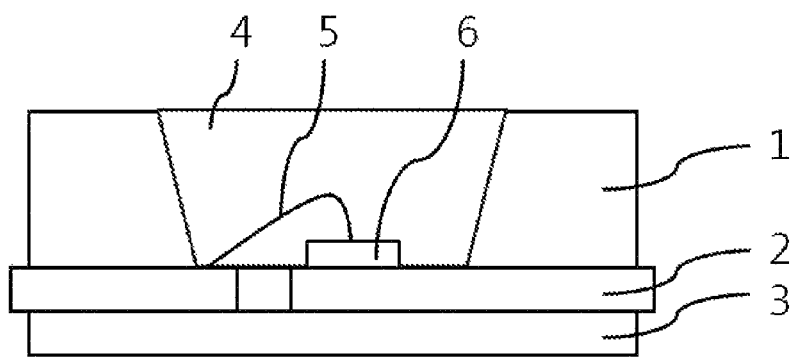

POLYESTER RESIN COMPOSITION HAVING IMPROVED MECHANICAL PROPERTIES AND MOLDABILITY

CROSS-REFERENCE TO RELATED APPLICATIONS

This application is a continuation of U.S. application Ser. No. 14/674,214, filed on Mar. 31, 2015, pending, and claims priority under 35 USC Section 119 to and the benefit of Korean Patent Application 10-2014-0038568, filed Apr. 1, 2014, and Korean Patent Application 10-2015-0040579, filed Mar. 24, 2015, the entire disclosure of each of which is incorporated herein by reference.

FIELD OF THE INVENTION

The present invention relates to a polyester resin composition, which can exhibit improved mechanical properties and moldability and thus can be suitable for use in light emitting diode (LED) reflectors.

BACKGROUND

Light emitting diodes (LEDs) and organic light emitting diodes (OLEDs) are rapidly replacing existing light sources due to outstanding energy efficiency and long lifespan thereof. Generally, light emitting diodes form a light emitting diode package in conjunction with components such as reflectors, reflector cups, scramblers, housings and the like, so as to be able to maximize optical efficiency through high reflectance. Such components should be able to withstand high temperatures and to minimize deterioration of whiteness due to reflectance reduction and yellowing.

Polyester resins, such as highly heat-resistant polyester resins and the like, are mainly used for the components. However, existing highly heat-resistant polyester resins have problems of extremely slow crystallization rate and deteriorated impact resistance.

To solve these problems, typically, attempts have been made to improve crystallization rate and impact resistance by adding additives such as inorganic fillers, nucleating agents and the like to the polyester resins. However, when an excess amount of the additives is used, there is a concern of rapid reduction in moldability and mechanical properties of the polyester resins.

Korean Patent Laid-open Publication No. 10-2013-0076733 discloses a polyester resin composition including a white pigment and a polyolefin copolymer. However, such a polyester resin composition can still have problems such as slow crystallization rate, poor moldability and molding stability, insufficient improvement in mechanical properties, and the like.

Therefore, there is a need for a polyester resin composition which exhibits excellent properties in terms of mechanical properties, heat resistance, improved moldability and stability by increasing crystallization rate so as to be used as components for light emitting diodes.

SUMMARY

The present invention provides a polyester resin composition, which can significantly reduce solidification time upon injection molding due to increased crystallization rate, can reduce an initial possibility of discoloration upon preparation, and can exhibit excellent moldability, molding stability and mechanical properties such as flexural strength and the like, and a molded article which is suitable for LED reflectors by securing excellent moldability, molding stability and mechanical properties while minimizing deformation.

The polyester resin composition includes: (A) a polyester resin which includes a polymer of a dicarboxylic acid component including an aromatic dicarboxylic acid and a diol component including an alicyclic diol having a trans/cis isomer ratio of about 2.3 or more; (B) a white pigment; and (C) inorganic fillers.

In exemplary embodiments, the polyester resin may include a repeat unit represented by Formula 1:

[Formula 1]

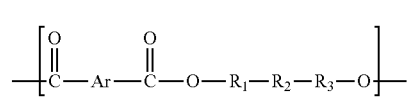

wherein Ar is a $C_6$ to $C_{18}$ arylene group; $R_1$ and $R_3$ are the same or different and are each independently a $C_1$ to $C_{10}$ linear alkylene group; $R_2$ is a $C_3$ to $C_{12}$ cyclic alkylene group; and $R_1$, $R_2$ and $R_3$ are derived from an alicyclic diol having a trans/cis isomer ratio of 2.3 or more and a total carbon number of 5 to 22.

In exemplary embodiments, the alicyclic diol may have a trans/cis isomer ratio of about 2.3 to about 10.

In exemplary embodiments, the alicyclic diol may have a trans/cis isomer ratio of about 2.5 to about 5.

In exemplary embodiments, the polyester resin composition may include: about 10% by weight (wt %) to about 80 wt % of the (A) polyester resin; about 5 wt % to about 60 wt % of the (B) white pigment; and about 1 wt % to about 40 wt % of the (C) inorganic fillers.

In exemplary embodiments, the (C) inorganic fillers may include at least one of glass fibers, carbon fibers, ceramic fibers, metal fibers, glass beads, carbon black, mica, talc, wollastonite, calcium carbonate, silica, alumina, aluminum hydroxide, clay, barium sulfate, and/or whiskers.

The present invention also relates to a molded article. The molded article is formed from the polyester resin composition as set forth above.

In exemplary embodiments, the molded article may have a flexural strength at break from about 40 N to about 80 N, as measured by applying compressive strength to a specimen at a rate of about 1 mm/min using a universal testing machine (UTM).

In exemplary embodiments, the molded article may be a reflector and/or reflector cup for LEDs.

BRIEF DESCRIPTION OF THE DRAWINGS

FIG. 1 is a sectional view of a semiconductor apparatus including a reflector cup formed from a polyester resin composition according to an exemplary embodiment of the present invention.

DETAILED DESCRIPTION

Exemplary embodiments now will be described more fully hereinafter in the following detailed description, in which some, but not all embodiments of the invention are described. Indeed, this invention may be embodied in many different forms and should not be construed as limited to the embodiments set forth herein; rather, these embodiments are provided so that this disclosure will satisfy applicable legal requirements.

Now, a polyester resin composition according to one embodiment of the present invention will be described in detail. It should be understood that the following embodiments are provided for complete disclosure and thorough understanding of the invention by those skilled in the art. In addition, unless otherwise stated, technical and scientific terms as used herein have a meaning generally understood by those skilled in the art. Descriptions of known functions and constructions which may unnecessarily obscure the subject matter of the present invention will be omitted.

A polyester resin composition according to exemplary embodiments of the present invention includes: (A) a polyester resin; (B) a white pigment; and (C) inorganic fillers.

(A) Polyester Resin

According to the present invention, the polyester resin includes a polymer (aromatic polyester resin) of a dicarboxylic acid component including an aromatic dicarboxylic acid and a diol component including an alicyclic diol having a trans/cis isomer ratio of about 2.3 or more.

In exemplary embodiments, the dicarboxylic acid component may include an aromatic dicarboxylic acid used for typical polyester resins, for example, a $C_8$ to $C_{20}$ aromatic dicarboxylic acid, and may further include a linear and/or cyclic aliphatic dicarboxylic acid as needed. Examples of the aromatic dicarboxylic acid may include without limitation terephthalic acid, isophthalic acid, phthalic acid, naphthalenedicarboxylic acid, and the like. These may be used alone or in combination thereof. In exemplary embodiments, the aromatic dicarboxylic acid may be terephthalic acid.

In exemplary embodiments, the diol component includes an alicyclic diol having a trans/cis isomer ratio of about 2.3 or more, and serves to improve heat resistance of the polyester resin and to impart improved moldability, mechanical properties, discoloration resistance and photostability to the combined polyester resin composition. If the trans/cis isomer ratio of the alicyclic diol is less than about 2.3, a crystallization rate of the polyester resin can be reduced and solidification time upon injection molding of the polyester resin composition can be increased, and thus there is a concern in that the polyester resin composition can suffer from initial discoloration and deterioration in discoloration resistance, mechanical properties, and the like.

For example, the alicyclic diol may be a $C_5$ to $C_{22}$ alicyclic diol, such as but not limited to cyclohexanedimethanol (CHDM), and the trans/cis isomer ratio of the alicyclic diol may range, for example, from about 2.3 to about 10, and as another example from about 2.5 to about 5. In some embodiments, the trans/cis isomer ratio of the alicyclic diol may range from about 2.3, 2.4, 2.5, 2.6, 2.7, 2.8, 2.9, 3, 4, 5, 6, 7, 8, 9, or 10. Further, according to some embodiments of the present invention, the trans/cis isomer ratio of the alicyclic diol can be in a range from about any of the foregoing amounts to about any other of the foregoing amounts.

Within this range, the polyester resin can exhibit excellent heat resistance, and the polyester resin composition can exhibit excellent properties in terms of moldability, mechanical properties, discoloration resistance, photostability and the like.

In exemplary embodiments, the diol component may further include ethylene glycol (EG), which is an aliphatic diol, in addition to the alicyclic diol. When the diol component includes ethylene glycol, ethylene glycol may be present in an amount of about 85 wt % or less, for example, about 20 wt % to about 70 wt %, based on 100 wt % of the total diol component. In some embodiments, the diol component of the polyester resin (A) may include ethylene glycol in an amount of 0 (ethylene glycol is not present), about 0 (ethylene glycol is present), 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, or 85 wt %. Further, according to some embodiments of the present invention, the amount of ethylene glycol can be in a range from about any of the foregoing amounts to about any other of the foregoing amounts.

Within this range, the polyester resin can exhibit improved impact resistance with minimal or no deterioration in heat resistance thereof.

In addition, the diol component may also optionally further include a $C_6$ to $C_{21}$ aromatic diol, a $C_3$ to $C_8$ aliphatic diol, or a mixture thereof in addition to the alicyclic diol. Examples of the $C_6$ to $C_{21}$ aromatic diol may include without limitation 2,2-bis-(3-hydroxyethoxyphenyl)-propane, 2,2-bis-(4-hydroxypropoxyphenyl)-propane and the like, and examples of the $C_3$ to $C_8$ aliphatic diol may include without limitation propane-1,3-diol, butane-1,4-diol, pentane-1,5-diol, hexane-1,6-diol, 3-methylpentane-2,4-diol, 2-methylpentane-1,4-diol, 2,2,4-trimethylpentane-1,3-diol, 2-ethylhexane-1,3-diol, 2,2-diethylpropane-1,3-diol and the like. These may be used alone or in combination thereof. In use, the $C_6$ to $C_{21}$ aromatic diol, the $C_3$ to $C_8$ aliphatic diol, or a mixture thereof may be present in an amount of about 3 wt % or less based on 100 wt % of the total diol component.

In exemplary embodiments, the (A) polyester resin may include a repeat unit represented by Formula 1:

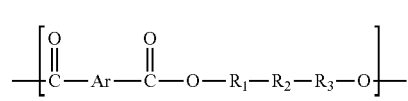

[Formula 1]

wherein Ar is a $C_6$ to $C_{18}$ arylene group; $R_1$ and $R_3$ are the same or different and are each independently a $C_1$ to $C_{10}$ linear alkylene group; $R_2$ is a $C_3$ to $C_{12}$ cyclic alkylene group; and $R_1$, $R_2$ and $R_3$ are derived from an alicyclic diol having a trans/cis isomer ratio of 2.3 or more and have a total carbon number of 5 to 22.

In exemplary embodiments, the (A) aromatic polyester resin may include a polycyclohexylenedimethylene terephthalate (PCT) resin represented by Formula 2, without being limited thereto:

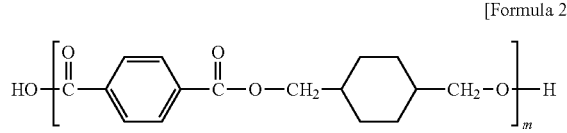

[Formula 2]

wherein m is an integer from 10 to 500.

In exemplary embodiments, the (A) polyester resin may be obtained by mixing at least two polyester resins polymerized from alicyclic diols having different trans/cis isomer ratios within the range of the trans/cis isomer ratio of the alicyclic diol as set forth above.

An alicyclic diol such as cyclohexanedimethanol (CHDM) used for typical polyester resins has a trans/cis isomer ratio of about 2.1. In this case, in order to achieve desired mechanical properties for a polyester resin composition, additives such as additional impact modifiers and the like are added. In contrast, the (A) polyester resin according to the present invention is obtained using the alicyclic diol having a trans/cis isomer ratio of about 2.3 or more, can significantly improve mechanical properties, such as flexural strength, and discoloration resistance of the polyester resin composition, and can reduce solidification time upon injection molding.

In exemplary embodiments, the (A) polyester resin may have an intrinsic viscosity [η] of about 0.4 dl/g to about 1.5 dl/g, for example, about 0.5 dl/g to about 1.2 dl/g, as measured at 35° C. using an o-chlorophenol solution (concentration: about 0.5 g/dl). Within this range, the polyester resin composition can exhibit excellent mechanical properties and moldability.

In exemplary embodiments, the (A) polyester resin may be prepared by polycondensation processes as known in the art. For example, polycondensation may include direct condensation of an acid through transesterification using a glycol or a lower alkyl ester, without being limited thereto.

In exemplary embodiments, the (A) polyester resin may have a weight average molecular weight of about 3,000 g/mol to about 30,000 g/mol, for example, about 5,000 g/mol to about 20,000 g/mol, as measured by gel permeation chromatography (GPC). Within this range, the polyester resin composition can exhibit excellent moldability, mechanical properties and the like.

In exemplary embodiments, the (A) polyester resin has a structure in which a polymer backbone includes a ring-shaped structure, and thus has a high melting point. The polyester resin may have a melting point of about 200° C. or more, for example, about 220° C. to about 380° C., and as another example about 260° C. to about 320° C.

In exemplary embodiments, the (A) polyester resin may further include an aromatic polyester polymer using an alicyclic diol having a trans/cis isomer ratio of less than about 2.3 as the diol component. When the polyester resin includes the aromatic polyester resin using the alicyclic diol having a trans/cis isomer ratio of less than about 2.3, the aromatic polyester resin may be present in an amount of about 90 wt % or less, for example, about 50 wt % or less, and as another example about 10 wt % or less, based on 100 wt % of the (A) total polyester resin. In some embodiments, the polyester resin (A) may include the aromatic polyester polymer using an alicyclic diol having a trans/cis isomer ratio of less than about 2.3 as the diol component in an amount of 0 (the polyester resin is not present), about 0 (the polyester resin is present), 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, or 90 wt %. Further, according to some embodiments of the present invention, the amount of the aromatic polyester polymer using an alicyclic diol having a trans/cis isomer ratio of less than about 2.3 as the diol component can be in a range from about any of the foregoing amounts to about any other of the foregoing amounts.

Within this range, solidification time can be reduced upon injection molding of the polyester resin composition, and the polyester resin composition can exhibit improved flexural strength and the like.

In exemplary embodiments, the polyester resin composition may include the (A) polyester resin in an amount of about 10 wt % to about 80 wt %, for example, about 40 wt % to about 70 wt %, based on 100 wt % of the total polyester resin composition. In some embodiments, the polyester resin composition may include the polyester resin in an amount of about 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, or 80 wt %. Further, according to some embodiments of the present invention, the amount of the polyester resin can be in a range from about any of the foregoing amounts to about any other of the foregoing amounts.

Within this range, the polyester resin composition can exhibit excellent properties in terms of heat resistance, moldability, mechanical properties, discoloration resistance, photostability, and the like.

(B) White Pigment

According to the present invention, in combination with other components, the white pigment can increase whiteness, reflectance and the like of the polyester resin composition and improve discoloration resistance, photostability and the like even at high temperature. The white pigment may be any typical white pigment without limitation. Examples of the white pigment may include without limitation titanium oxide, zinc oxide, zinc sulfide, white lead $(2PbCO_3.Pb(OH)_2)$, zinc sulfate, barium sulfate, calcium carbonate, alumina, and the like. These may be used alone or in combination thereof.

In exemplary embodiments, the white pigment may include titanium oxide which exhibits high whiteness, high reflectance, dispersibility, excellent weather resistance, and chemical stability, depending on combination with other components. Although titanium oxide can have any crystal structure without limitation, the titanium oxide can have a rutile-type or tetragonal crystal structure since titanium oxide of a rutile-type or tetragonal crystal structure is stable when exposed to high temperature for a long period of time and can effectively prevent deterioration of reflectance of the polyester resin composition.

In exemplary embodiments, the white pigment may have an average particle diameter of about 0.01 μm to about 2.0 μm, for example, about 0.05 μm to about 0.7 μm. Within this range, the resin composition can exhibit excellent whiteness, reflectance and the like.

In exemplary embodiments, the white pigment may be surface-treated with an organic and/or inorganic surface treating agent. Examples of the organic surface treating agent may include without limitation silane coupling agents, polydimethylsiloxane, trimethylolpropane (TMP), pentaerythritol, and the like. These may be used alone or in combination thereof. Examples of the silane coupling agents may include without limitation vinyltriethoxysilane, 2-aminopropyltri ethoxysilane, 2-glycidoxypropyltriethoxysilane, and the like. Examples of the inorganic surface treating agent may include without limitation aluminum oxide (alumina, $Al_2O_3$), silicon dioxide (silica, $SiO_2$), zirconia (zirconium dioxide, $ZrO_2$), sodium silicate, sodium aluminate, sodium aluminum silicate, zinc oxide, mica, and the like. These may be used alone or in combination thereof. When present, upon surface treatment, the organic and/or inorganic surface treating agent may be present in an amount of greater than zero parts by weight to about 5 parts by weight based on about 100 parts by weight of the white pigment. Within this range, the resin composition can exhibit better whiteness, reflectance, and the like.

In exemplary embodiments, the polyester resin composition may include the white pigment in an amount of about 5 wt % to about 60 wt %, for example, about 15 wt % to about 40 wt %, based on 100 wt % of the total polyester resin composition. In some embodiments, the polyester resin composition may include the white pigment in an amount of about 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, or 60 wt %. Further, according to some embodiments of the present invention, the amount of the white pigment can be in a range from about any of the foregoing amounts to about any other of the foregoing amounts.

Within this range, the polyester resin composition can exhibit excellent properties in terms of whiteness, reflectance, impact resistance, mechanical strength, discoloration resistance, photostability, and the like.

(C) Inorganic Filler

According to exemplary embodiments, the inorganic fillers can improve mechanical strength of the polyester resin composition, and may be any inorganic filler known in the art without limitation. The inorganic fillers may have a shape such as fiber shapes, particle shapes, rod shapes, acicular shapes, flake shapes, and/or amorphous shapes, and the like. In addition, the inorganic fillers may have a cross-section of various shapes, such as circles, ellipses, and/or rectangles, and the like. Examples of the inorganic fillers may include without limitation fibrous inorganic fillers such as glass fibers, carbon fibers, ceramic fibers, metal fibers and the like, glass beads, carbon black, mica, talc, wollastonite, calcium carbonate, aluminum hydroxide, clay, and/or whiskers. These may be used alone or in combination thereof.

In exemplary embodiments, the inorganic fillers may be glass fibers in consideration of mechanical properties.

In exemplary embodiments, the glass fibers may be glass fibers having circular and/or rectangular cross sections.

The glass fibers having a circular cross section may have a cross-sectional diameter of about 5 μm to about 20 μm, and a pre-processing length of about 2 mm to about 20 mm. The glass fibers having a rectangular cross section may have a cross-sectional aspect ratio of about 1.5 to about 10, and a pre-processing length of about 2 mm to about 20 mm. When the glass fibers are used as the inorganic fillers, the resin composition may exhibit improved processability and a molded article can exhibit significantly improved mechanical properties such as flexural strength, impact strength, and the like.

In exemplary embodiments, the inorganic fillers may be subjected to surface coating with a surface treating agent to increase bonding force to the polyester resin. Examples of the surface treating agent may include, for example, silane compounds, urethane compounds, and/or epoxy compounds, without being limited thereto.

In addition, the inorganic fillers according to the present invention may be used as a nucleating agent. For example, when the polyester resin composition further includes talc as the nucleating agent, the resin composition can have faster solidification time upon injection molding due to faster crystallization rate thereof, and can exhibit improved mechanical properties in terms of flexural strength.

In exemplary embodiments, the polyester resin composition may include the inorganic filler in an amount of about 1 wt % to about 40 wt %, for example, about 10 wt % to about 20 wt %, based on 100 wt % of the total polyester resin composition. In some embodiments, the polyester resin composition may include the inorganic filler in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, or 40 wt %. Further, according to some embodiments of the present invention, the amount of the inorganic filler can be in a range from about any of the foregoing amounts to about any other of the foregoing amounts.

Within this range, the polyester resin composition can exhibit excellent mechanical properties, heat resistance, moldability and the like.

In exemplary embodiments, the polyester resin composition may include the white pigment and the inorganic fillers in a total amount of about 6 wt % to about 61 wt %, for example, about 45 wt % to about 55 wt %, based on 100 wt % of the total polyester resin composition. In some embodiments, the polyester resin composition may include the white pigment and the inorganic fillers in a total amount of about 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, or 61 wt %. Further, according to some embodiments of the present invention, the total amount of the white pigment and the inorganic fillers can be in a range from about any of the foregoing amounts to about any other of the foregoing amounts.

For example, in exemplary embodiments, the white pigment and the inorganic fillers may be present in a total amount of about 45 wt %, about 46 wt %, about 47 wt %, about 48 wt %, about 49 wt %, about 50 wt %, about 51 wt %, about 52 wt %, about 53 wt %, about 54 wt %, or about 55 wt %, based on 100 wt % of the total polyester resin composition.

Within this range, the polyester resin composition can exhibit excellent mechanical properties and heat resistance, and has improved discoloration resistance.

According to the present invention, the polyester resin composition may further include one or more of a typical additive in addition to the components as set forth above depending upon desired purposes. Examples of the additive may include without limitation antimicrobial agents, heat stabilizers, antioxidants, release agents, photostabilizers, surfactants, coupling agents, plasticizers, compatibilizers, lubricants, antistatic agents, flame retardants, flame retardant aids, anti-dripping agents, weather resistant stabilizers, UV absorbers, UV blocking agents, and the like, and mixtures thereof.

The additive may be present in an appropriate amount within a range in which properties of the polyester resin composition are not deteriorated. For example, the additive may be present in an amount of about 20 parts by weight or less, for example, about 0.1 parts by weight to about 15 parts by weight, based on about 100 parts by weight of the polyester resin composition.

According to the present invention, the polyester resin composition may be prepared by a method known in the art. For example, the components and the optional additive(s) can be mixed using a Henschel mixer, a V blender, a tumbler blender, a ribbon blender or the like, followed by melt extrusion at a temperature of about 150° C. to about 350° C. using a single-screw or twin-screw extruder, thereby preparing a polyester resin composition in pellet form. In exemplary embodiments, the mixture of the components and the optional additive(s) is subjected to extrusion at a temperature of about 250° C. to about 310° C. at a screw rotating speed of about 300 rpm to about 600 rpm and at a self-supply rate of about 60 kg/hr to about 600 kg/hr using a twin-screw extruder having L/D=about 29 and 1=about 36 mm, thereby preparing a polyester resin composition in pellet form.

According to the present invention, a molded article is formed from the polyester resin composition as set forth above. For example, using the polyester resin composition, the molded article may be manufactured by a molding method known in the art, such as injection molding, dual injection molding, blow molding, extrusion, thermoforming, and the like. The molded article to which the polyester resin composition is applied can exhibit improved mechanical properties, and can have a reduced possibility of discoloration upon manufacture due to reduction in solidification time upon injection molding.

In exemplary embodiments, the molded article may have a flexural strength at break of about 40 N to about 80 N, as measured by compressing the molded article at a rate of about 1 mm/min using a universal testing machine (UTM).

According to the present invention, since the molded article contains a polyester resin, which includes a polymer of a dicarboxylic acid component including an aromatic dicarboxylic acid and a diol component including an alicyclic diol having a trans/cis isomer ratio of about 2.3 or more, a white pigment, and the like, the molded article can exhibit significantly improved mechanical properties such as flexural strength and can have a significantly reduced solidification time upon injection molding. Therefore, the molded article according to the present invention can be useful as a reflector and/or reflector cup for LEDs, which require such properties.

FIG. 1 is a sectional view of a semiconductor apparatus (package) including a reflector cup formed from a polyester resin composition according to one embodiment of the present invention. As shown in FIG. 1, the polyester resin composition according to the present invention may be formed into a reflector and/or reflector cup 1 of various shapes, and the prepared reflector cup 1 may be assembled into a product including a light emitting diode (LED) or organic light emitting diode (OLED), such as semiconductor apparatuses, illumination apparatuses and the like, in conjunction with various electrodes 2, substrates 3, sealing resins 4, wires 5, light emitting diodes (LEDs) 6 and the like, which are known in the art. In addition, the constitution as set forth above can be variously modified and changed by those skilled in the art.

Hereinafter, the present invention will be explained in more detail with reference to the following examples. It should be understood that these examples are not to be in any way construed as limiting the present invention.

Measurement of Properties (1) Measurement of Package Bending Strength (Unit: N)

A piece (specimen) is separated from a molded article formed by insert injection molding of a 7032 metal LED lead frame using a hand cutter, followed by measurement of compressive strength and package bending strength at break at a rate of 1 mm/min using a universal testing machine (UTM).

(2) Measurement of Solidification Time upon Injection Molding (Unit: Sec)

A 7032 (16 cavity) mold is mounted in an injection molding machine, followed by insert injection molding of a metal LED lead frame, thereby measuring minimum solidification time at which a sprue is not broken and normal molding is performed.

Details of components used in Examples and Comparative Examples are as follows.

(A-1) Polyester Resin

A PCT resin (SK Chemical Co., Ltd., trans/cis isomer ratio=2.10) is used.

(A-2) Polyester Resin

A PCT resin (SK Chemical Co., Ltd., trans/cis isomer ratio=2.85) is used.

(B) White Pigment

TIONA RL-91 (Millennium Co., Ltd., USA) is used.

(C) Inorganic Filler

Glass fibers of a circular cross section (910, Owens Corning Co., Ltd.), having a cross-sectional diameter of 10 μm and an average length of 3 mm, are used.

(D) Nucleating Agent

Talc (Hayashi Hwaseong Co., Ltd.) is used.

Example 1

As listed in Table 1, 60 wt % of the (A-2) polyester resin, 20 wt % of the (B) white pigment and 20 wt % of the (C) inorganic fillers are mixed, followed by dry blending, thereby preparing a polyester resin composition. Next, the polyester resin composition is processed at a barrel temperature from 250° C. to 310° C. using a twin-screw extruder having Φ=36 mm, thereby manufacturing pellets. The manufactured pellets are dried at 80° C. for 4 hours or more, and then injection-molded into a specimen. Next, properties of the specimen are evaluated. Results are shown in Table 2.

Example 2

A specimen is prepared in the same manner as in Example 1 except that amounts of the (A-1) and (A-2) polyester resins are modified as listed in Table 1. Next, properties of the specimen are measured. Results are shown in Table 2.

Example 3

A specimen is prepared in the same manner as in Example 1 except that the (D) nucleating agent is further added as listed in Table 1. Next, properties of the specimen are measured. Results are shown in Table 2.

Comparative Example 1

A specimen is prepared in the same manner as in Example 1 except that only the (A-1) polyester resin is used instead of the (A-2) polyester resin as listed in Table 1. Next, properties of the specimen are measured. Results are shown in Table 2.

Comparative Example 2

A specimen is prepared in the same manner as in Example 3 except that only the (A-1) polyester resin is used instead of the (A-2) polyester resin as listed in Table 1. Next, properties of the specimen are measured. Results are shown in Table 2.

TABLE 1

|  | Example 1 | Example 2 | Example 3 | Comparative Example 1 | Comparative Example 2 |
|---|---|---|---|---|---|
| (A-1) Polyester resin (wt %) | — | 30 | — | 60 | 60 |
| (A-2) Polyester resin (wt %) | 60 | 30 | 60 | — | — |

TABLE 1-continued

|  | Example 1 | Example 2 | Example 3 | Comparative Example 1 | Comparative Example 2 |
|---|---|---|---|---|---|
| (B) White pigment (wt %) | 20 | 20 | 20 | 20 | 20 |
| (C) Inorganic filler (wt %) | 20 | 20 | 20 | 20 | 20 |
| (D) Nucleating agent (parts by weight) | — | — | 1 | — | 1 |

Parts by weight: parts by weight based on 100 parts by weight of (A-1), (A-2), (B) and (C)

TABLE 2

|  | Example 1 | Example 2 | Example 3 | Comparative Example 1 | Comparative Example 2 |
|---|---|---|---|---|---|
| Package bending strength (N) | 49 | 42 | 53 | 35 | 38 |
| Solidification time upon injection molding (sec) | 18 | 23 | 10 | 30 | 25 |

As shown in Table 2, the specimens of Examples 1 to 4 exhibit excellent mechanical properties including flexural strength, have significantly reduced solidification time upon injection molding, and exhibit improved discoloration resistance.

In contrast, the specimens of Comparative Examples 1 and 2 using the only the polyester resin having a trans/cis isomer ratio outside of the range according to the present invention exhibit deteriorated mechanical properties such as flexural strength and have insignificantly reduced solidification time upon injection molding.

Therefore, it can be seen that when the polyester resin having a trans/cis isomer ratio within the range according to the present invention is used, the specimen exhibits improved mechanical properties and moldability as well as significantly improved heat resistance and discoloration resistance.

Many modifications and other embodiments of the invention will come to mind to one skilled in the art to which this invention pertains. Therefore, it is to be understood that the invention is not to be limited to the specific embodiments disclosed and that such modifications and other embodiments are intended to be included within the scope of the appended claims and equivalents thereof.

What is claimed is:

1. A polyester resin composition comprising:
   (A) polycyclohexylenedimethylene terephthalate (PCT) resin which is a polymer of terephthalic acid and cyclohexanedimethanol, wherein the cyclohexanedimethanol has a trans/cis isomer ratio of about 2.8 to about 5;
   (B) a white pigment, wherein the white pigment is titanium dioxide; and
   (C) inorganic fillers, wherein the inorganic fillers are glass fibers.

2. The polyester resin composition according to claim 1, wherein the polyester resin composition comprises: about 10 wt % to about 80 wt % of the (A) polycyclohexylenedimethylene terephthalate (PCT) resin; about 5 wt % to about 60 wt % of the (B) white pigment; and about 1 wt % to about 40 wt % of the (C) inorganic fillers.

3. The polyester resin composition according to claim 1, comprising:
   about 40 wt % to about 70 wt % of the (A) polycyclohexylenedimethylene terephthalate (PCT) resin;
   about 15 wt % to about 40 wt % of the (B) white pigment; and
   about 10 wt % to about 20 wt % of the (C) inorganic fillers.

4. A molded article formed from the polyester resin composition according to claim 1.

5. The molded article according to claim 4, wherein the molded article is a reflector for a light emitting diode (LED).

6. The molded article according to claim 4, wherein the molded article is a reflector cup for a light emitting diode (LED).

* * * * *